United States Patent [19]

Middelhoek et al.

[11] Patent Number: 5,017,978
[45] Date of Patent: May 21, 1991

[54] EPROM HAVING A REDUCED NUMBER OF CONTACTS

[75] Inventors: Jan Middelhoek, Hengelo; Gerrit-Jan Hemink, Enschede; Rutger C. M. Wijburg, Hengelo, all of Netherlands

[73] Assignee: U.S. Philips Corp., New York, N.Y.

[21] Appl. No.: 497,953

[22] Filed: Mar. 22, 1990

[30] Foreign Application Priority Data

Mar. 31, 1989 [EP] European Pat. Off. ........ 89200830.1

[51] Int. Cl.⁵ .................... H01L 27/01; H01L 29/00; H01L 29/78
[52] U.S. Cl. ................... 357/23.5; 365/185; 365/184; 365/104
[58] Field of Search ............... 357/23.5, 23.6; 365/185, 184, 104

[56] References Cited

U.S. PATENT DOCUMENTS

| | | | |
|---|---|---|---|
| 4,112,509 | 9/1978 | Wall | 357/23.5 |
| 4,184,207 | 1/1980 | McElroy | 365/185 |
| 4,281,397 | 7/1981 | Neal et al. | 365/189 |
| 4,334,292 | 6/1982 | Kotecha | 357/23.5 |
| 4,887,238 | 12/1989 | Bergemont | 365/185 |
| 4,905,194 | 2/1990 | Ohtsuka et al. | 365/185 |
| 4,912,676 | 3/1990 | Paterson et al. | 357/23.5 |
| 4,930,105 | 5/1990 | Matsumoto et al. | 365/184 |

FOREIGN PATENT DOCUMENTS

| | | | |
|---|---|---|---|
| 133667A-2 | 7/1986 | European Pat. Off. | 357/23.5 |
| 60-140600 | 7/1985 | Japan | 365/104 |
| 8802174 | 3/1988 | World Int. Prop. O. | 357/23.5 |

Primary Examiner—Jerome Jackson, Jr.
Assistant Examiner—Dang Xuan Hung
Attorney, Agent, or Firm—Steven R. Biren

[57] ABSTRACT

An integrated circuit includes a memory having cells arranged in rows and columns, each cell having transistor being connected between two bit lines and having a current channel, a control gate and a charge-storage region therebetween, neighboring cells in a same row having a bit line contact in common, and control gates of transistors in a row being connected to a same word line, wherein each transistor has in a substrate of a first conductivity type a source region, a drain region and an injector region of a second conductivity type and mutually separated from each other, the injector regions of the transistors in a first row being controllable via the bit line contacts of the transistors in a second row adjacent to said first row. Preferably, at least one source region, at least one drain region and at least one injector region that are connected to a same bit line contact form a coherent region, e.g. a well, in the substrate. Preferably, the first and second row have the word line in common. The multiple use of bit line and word lines contribute to a dense memory.

4 Claims, 2 Drawing Sheets

EPROM HAVING A REDUCED NUMBER OF CONTACTS

BACKGROUND OF THE INVENTION

The invention relates to an integrated circuit, comprising a memory having cells arranged in rows and columns, each cell comprising a transistor connected between two bit lines and having a current channel, a control gate and a charge-storage region therebetween, neighboring cells in a same row having a bit line contact in common, and control gates of transistors in a row being connected to a same word line.

An integrated circuit of this kind is known, for instance from the U.S. Pat. No. 4,281,397. The disclosed circuit comprises a memory matrix, in a first row whereof a first pair of cells in neighboring columns have a single bit line contact in common with a second row adjacent to the first row. The transistor has three control terminals: a source and a drain, both connected to consecutive bit lines, and a control gate, connected to a word line. In addition the transistor has a charge-storage region formed by a floating gate, capacitively coupled to the control gate. Programming of said transistor is accomplished by applying the programming voltage between the source and the drain while holding the control gate at the high programming voltage. A current through the transistor thereby causes tunneling of some charge carriers towards the floating gate. The charge trapped at the floating gate determines the threshold voltage of the transistor, indicative of its logical state.

The multiple use of bit line contacts leads to a dense memory matrix. A similar architecture with multiple use of bit line contacts could also be applied to a memory comprising transistors, each whereof has, in addition to the control terminals mentioned above, a separate injector. An example of such a transistor is described in U.S. Pat. No. 4,334,292. This latter transistor has in a substrate of a first conductivity type, drain- and source-regions of a second conductivity type, the injector comprising a part isolated from and extending opposite the charge-storage region, which also is isolated from said substrate. However, utilizing the known architecture in a straightforward way, would lead to a memory matrix wherein the number of control lines and contacts would increase considerably, for each injector should be (as it is disclosed) connected to a respective control line.

SUMMARY OF THE INVENTION

It is therefore an object of the invention to provide an integrated circuit of the kind set forth alone, wherein each memory cell comprises a transitor having an injector, and wherein the number of contacts is considerably lower than would follow from applying the prior art architecture.

To this end, an integrated circuit according to the invention is characterized in that each transistor has in a substrate of a first conductivity type, a source region, a drain region and an injector region of a second conductivity type and mutually separated from each other, the injector regions of the transistors in a first row being controllable via the bit line contacts of the transistors in a second row adjacent to said first row. This implies that the main electrodes of the transistors connected to a common bit line contact in the second row are connected to the injector region of another transistor that is located in the first row adjacent the second row. The main electrodes and the injector regions all are of the same conductivity type and may therefore be constituted by a single well in the substrate. A periodic expansion of intercoupled arrangements of first and second rows leads to a memory, wherein the voltages at the connection of current channels of two neighboring transistors and the voltages of the injectors of two other transistors are controlled via a single bit line contact.

An embodiment of an integrated circuit according to the invention is characterized in that the memory comprises a third row and a fourth row respectively adjacent to and having bit line contacts in common with said first row and second row, respectively, for each pair of transistors, one of the first row and one of the third row, that forms a parallel arrangement via an associated bit line contact common to the injector of the transistor in the second row and, if present, the transistor in the row adjacent to said first row. A periodic expansion of intercoupled arrangements of first, second, third and fourth rows leads to a memory, wherein a single bit line contact provides a connection with four source or drain regions and two injector regions.

A further embodiment of an integrated circuit according to the invention is characterized in that two adjacent rows have one word line in common. In this construction a pair of consecutive rows utilizes a single word line, which still further reduces the area for the integrated circuit.

As in the previous embodiments, the applied control voltages permit the described circuits without interfacing destructively with the charge stored in non-selected cells.

BRIEF DESCRIPTION OF THE DRAWING

The invention will be illustrated, by way of example, in the accompanying diagrammatic drawing, in which.

DESCRIPTION OF THE PREFERRED EMBODIMENTS

Figure 1:
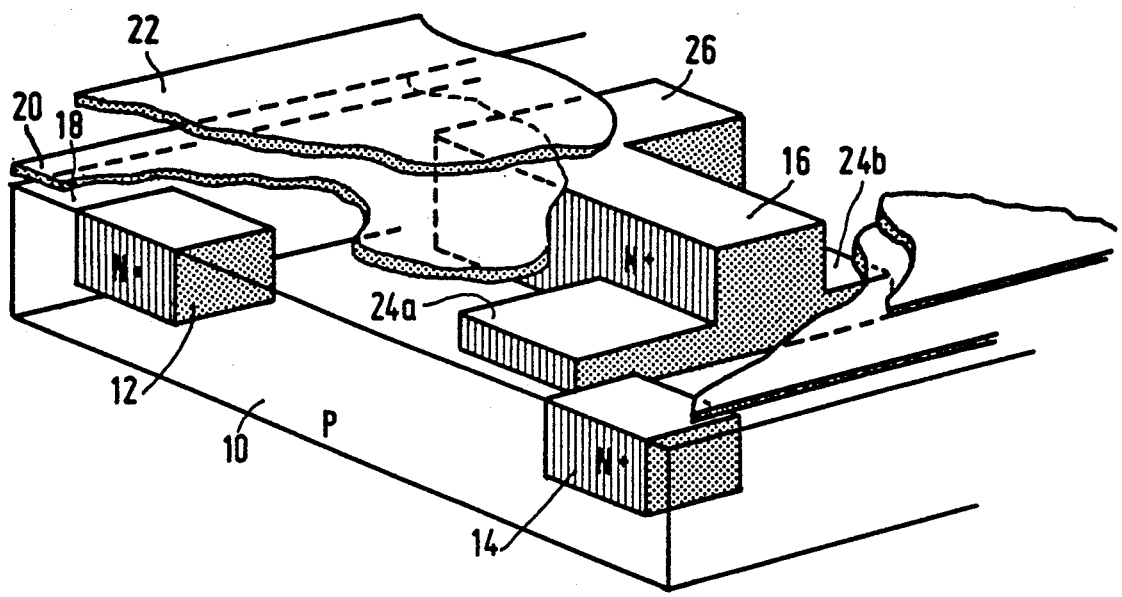
FIG. 1 shows a transistor in a preferred embodiment of an integrated circuit according to the invention.

In FIG. 1 the transistor, constituting a memory cell, is shown in a preferred embodiment. The shown transistor is described in further detail in the copending U.S. patent application No. 503,350, filed Mar. 30, 1990, and incorporated herein by reference, and will here be disclosed as far as is necessary for explaining the invention.

In a substrate 10 of the P-type, a source region 12, a drain region 14 and an injector region 16, all of the n+-type, are present. Electrically isolated from the surface 18 of substrate 10 a charge-storage region 20, for example a floating gate, is disposed below and electrically isolated from a control gate 22. For clarity the charge-storage region 20 and the control gate 22 have only been drawn partially. The injector region comprises a buried part 24a, extending below charge-storage region 20. By applying a high voltage pulse (e.g. 14 Volts) to control gate 22 while holding source region 12 and drain region 14 at e.g. 5 Volts and injector region 16 at e.g. 0 Volts a depletion layer is created in substrate 10 underneath charge-storage region 20, that contacts the depletion layer near the injector region part 24a. A punch-through mechanism then generates an emission of electrons directed vertically towards the charge-storage region. Because of the high voltage at control gate 22 and the voltages applied to the source- and drain regions 12 and 14, the emitted electrons are accelerated and acquire enough kinetic energy to pass through an isolation layer (not shown) between substrate surface 18 and charge-storage region 20, thereby entering the latter. At the charge-storage region 20, the electrons are trapped and determine the threshold voltage of the transistor until they are removed. The location of part 24a of injector region 16 that is burried underneath the charge-storage region 20 enables an efficient injection mechanism. The emitted electrons are accelerated vertically, and as a consequence thereof, the acquired energy is propagated mainly into the direction of charge-storage region 20. A read operation is accomplished by holding the control gate 22 at approximately 5 Volts, the drain region 14 at a voltage between 1 Volt and 2 Volts and the source region 18 at ground. It should be noted that the injector 16 can be held at approximately 0 Volts or at the same voltage as the drain region, while all other voltages are kept low with respect to programming voltages. In this condition no electrons will be injected because the depletion layer caused by the control gate pulse is at a voltage slightly above the voltage of the injector region 16 due to the low potentials at the drain and the source regions 12 and 14. It should further be noted that injector region 16 has several parts 24a and b that extend laterally in the substrate 10 so as to combine the injectors for at least two adjacent transistors within a common n+-well. As a consequence thereof the effective cell area is reduced.

The injector region 16 associated with the transistor defined by source region 14 and drain region 12 comprises an extension 26 that forms a source region or a drain region of an adjacent transistor. The combining of the injector region for one transistor with the source or drain of another transistor is possible as the cooperation of control voltages for programming or reading a selected cell does not interfere destructively with the storage of information in neighboring cells. The advantage of combining an injector of one cell with sources and drains of other neighboring cells lies in the fact that the cell dimensions now can be made small due to the interweaving of components and due to the reduction of contacts to be made.

In the next Figures examples are shown of this interweaving of components and the multiple use of bit lines and bit line contacts.

Figure 2:
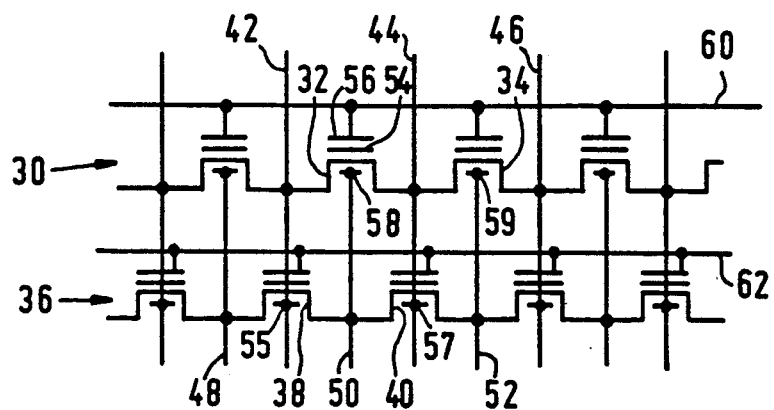
FIG. 2 shows a first diagram of an integrated circuit according to the invention.

In FIG. 2 a first diagram of an integrated circuit according to the invention is shown. The architecture relates to a memory comprising a first row 30 of cells, of which only cells 32 and 34 have been indicated, and a second row 36 of cells adjacent to the first row 30, of which second row only cells 38 and 40 have been indicated. Each cell is constituted by a transistor, for example a transistor of the kind shown in FIG. 1, that has its conduction channel connected between two bit lines. In the first row 30 transistor 32 is connected between bit lines 42 and 44 and transistors 34 is connected between bit lines 44 and 46. In this way neighboring cells have a single bit line in common. In the second row 36 transistor 38 is connected between bit lines 48 and 50, and transistor 40 is connected between bit lines 50 and 52. Each transistor, e.g. transistor 32, has been provided with a charge-storage region 54, e.g. a floating gate, a control gate 56 and an injector 58. The control gates of the transistors in the first row 30 and the second row 36 are connected to word line 60 and word line 62, respectively. The injectors (e.g. 55, 57, 58, 59) are connected to the bit lines (42, 50, 44, 52 respectively). The operation of programming a selected transistor, e.g. transistor 32, is accomplished by holding its associated bit lines, 42 and 44 and all further bit lines at approximately 5 Volts, except for the bit line 50, connected to injector 58, which is kept at 0 Volt while the associated word line 60 is being raised to approximately 15 Volts. A read operation in the selected transistor 32 requires a precharge to a voltage between 1 and 2 Volt of all bit lines, then the word line 60 is made to be approximately 5 Volts, and the injector 58 is thus also at 1 to 2 Volts, while the voltage on bit line 42 is at ground. Then the voltage on bit line 44 is sensed to detect a "zero" (=discharge of bit line 44) or a "one" (no discharge of bit line 44). The injectors in the first row 30 are connected between pairs of neighboring transistors in the second row 36 and to the bit lines associated to said pairs via the associated bit line contacts. Also, the injectors in the second row 36 are likewise connected to the bit lines associated with the first row 30. As has been described with reference to FIG. 1, such lay-out is allowed due to the fact that the injector region of one transistor can be combined with sources and drains of other transistors that are not located in the same row as the one transistor. By extending periodically the memory part shown in FIG. 2 it can easily be seen that a single bit line contact in a row, e.g. the bit line contact between transistors 32 and 34 in row 30, also operates under suitable voltage control as the contact to the injectors of the nearest transistors in the pair of rows that are adjacent the former row, of which pair only row 36 has been drawn in the FIG. 1.

Figure 3:
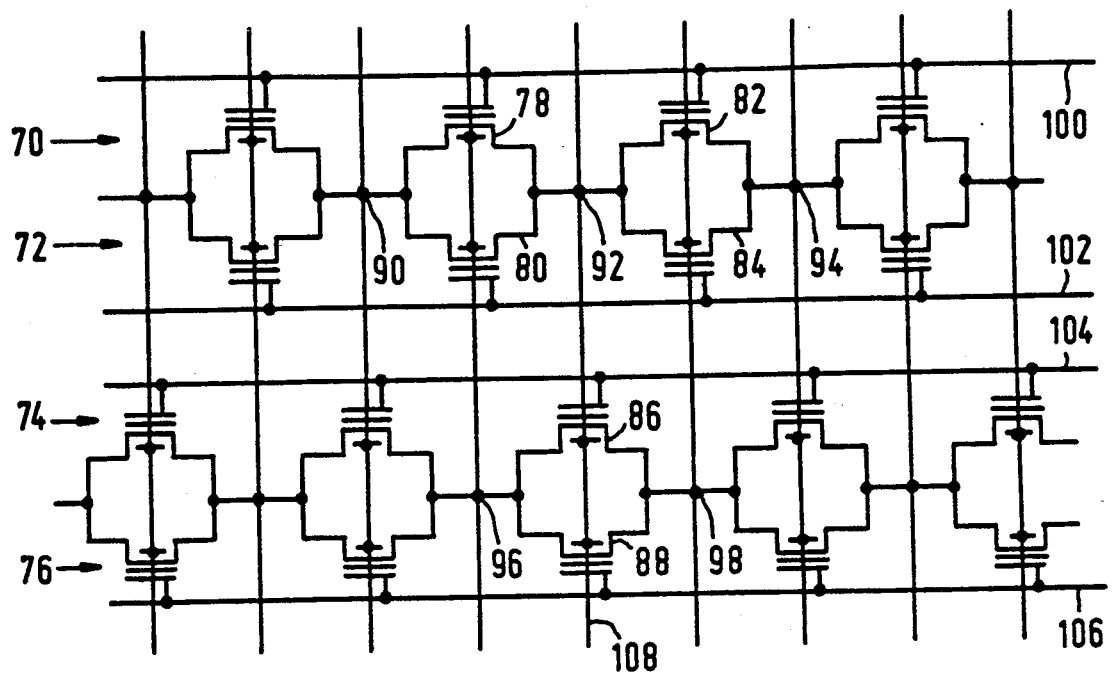
FIG. 3 shows a second diagram of an integrated circuit according to the invention.

A more dense memory has been drawn in FIG. 3 as a second example of an integrated circuit according to the invention. In this example pairs of rows, like 70 and 72, and like 74 and 76, have been disposed in such a way, that in each pair of rows the transistors constituting the memory cells pairwise form parallel arrangements, like transistors 78 and 80 and transistors 82 and 84, and like transistors 86 and 88, between the associated bit line contacts like 90 and 92, 92 and 94, and 96 and 98, respectively. Each row has been provided with an individual word line like word lines 100, 102, 104 and 106, that have been assigned to rows 70, 72, 74 and 76, respectively. The transistors have already been described in detail with reference to the previous drawings and will not be examined in further detail hereinbelow. As can be seen from the drawing, a bit line contact (for instance bit line contact 92) not only serves to connect the main electrodes of four transistors (transistors 78, 80, 82 and 84) to a single bit line (bit line 108), but also serves to control the injectors of the nearest two transistors of the adjacent pairs of rows (such as the interconnected injectors of transistors 86 and of the nearest transistors in the other row (not drawn), that is adjacent to row-pair 70–72). This dual function again is a consequence of realizing the main electrodes of e.g. transistors 78, 80, 82 and 84 connected to a same bit line contact 92 and the injectors of transistors 86 (and one of its mirror-pair at the other side of row-pair 70–72) in a same n+-well.

Figure 4:
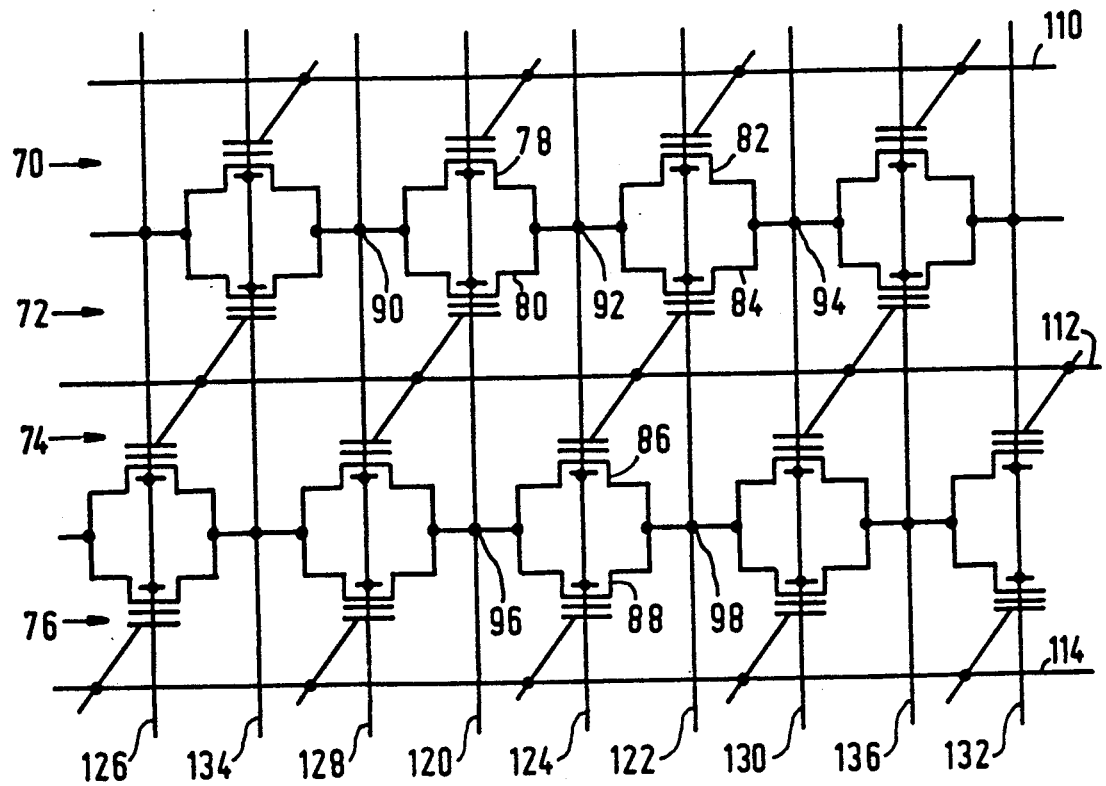
FIG. 4 shows a third diagram of an integrated circuit according to the invention.

In FIG. 4 a still more dense memory is shown as a third example of an integrated circuit according to the invention. Like reference numerals designate parts or components identical to or corresponding with those in FIG. 3. The diagram of FIG. 4 only differs from the diagram of FIG. 3 in the common use of word line 112 by two adjacent rows 72 and 74. The same pertains to the not shown rows adjacent to row 70 and 76 with regard to word lines 110 and 114, respectively. The common use of word lines further reduces the effective cell area. However, this reduction in effective cell area is attended by a slight increase in power consumption during programming as compared to the power consumed during programming of a selected cell in a memory according to the previous Figure. This will be explained on the basis of the following example. It is assumed that transistor 86 is selected for programming. This implies that bit lines 120 and 122 are kept at approximately 5 Volts, bit line 124 at ground, while word line 112 receives a pulse of approximately 15 Volts, as has been explained already with reference to the previous Figures. In order to inhibit programming the other transistors in row 74, bit lines 126, 128, 130 and 132, connected to the respective injectors are kept at 5 Volts. Also, in order to avoid current conduction via the other transistors in row 74, bit lines 134 and 136 are kept at approximately 5 Volts. Consequently, transistor 80 has its current channel connected between 5 Volts at bit line contact 90 and 0 Volt at bit line contact 92, and transistor 84 has its current channel connected between 5 Volts at bit line contact 94 and 0 Volt at bit line contact 92. The occurrence of a pulse of 15 Volts at word line 112 will therefore cause transistors 80 and 84 to conduct.

We claim:

1. An integrated circuit, comprising a substrate of a first conductivity type and a memory having bit lines, word lines and cells arranged in rows and columns, each cell comprising a transistor connected between two bit lines and having a current channel, a control gate and a charge-storage region therebetween, neighboring cells in a same row having a bit line contact in common, and control gates of transistors in a row being connected to a same word line, characterized in that each transistor has in said substrate of the first conductivity type a source region, a drain region and an injector region of a second conductivity type, mutually separated from each other, the injector regions of the transistors in a first row being connected to the bit line contacts of the transistors in a second row adjacent to said first row.

2. An integrated circuit as claimed in claim 1, wherein the memory further comprises a third row and a fourth row of cells, said third and fourth row being located adjacent to and having bit line contacts in common with said first row and second row, respectively, for each pair of transistors, one of the first row and one of the third row, that forms a parallel arrangement via an associated bit line contact common to the injector of the transistor in the second row.

3. An integrated circuit as claimed in claim 1 or 2, wherein two adjacent rows have one word line in common.

4. An integrated circuit as claimed in claim 1 or 2, wherein in a row at least one of a drain and a source region in a first column, at least one of a drain and a source region in a third column and at least one injector region in an adjacent row and in a second column, all of which regions are connected to a same bit line contact, form a coherent region in the substrate.

* * * * *